United States Patent
Clarkin et al.

(10) Patent No.: US 7,368,957 B2
(45) Date of Patent: May 6, 2008

(54) CAPACITIVELY COUPLED FLOATING GATE DRIVER

(75) Inventors: John P. Clarkin, Coventry, RI (US); Alex Gusinov, Lexington, MA (US); Claudio Tuozzolo, Johnston, RI (US); Patrizio Vinciarelli, Boston, MA (US)

(73) Assignee: Picor Corporation, North Smithfield, RI (US)

( * ) Notice: Subject to any disclaimer, the term of this patent is extended or adjusted under 35 U.S.C. 154(b) by 29 days.

(21) Appl. No.: 11/490,573

(22) Filed: Jul. 21, 2006

(65) Prior Publication Data

US 2008/0018364 A1    Jan. 24, 2008

(51) Int. Cl.
 *H03B 1/00* (2006.01)
(52) U.S. Cl. ............... 327/110; 327/109; 327/434; 323/259; 323/285
(58) Field of Classification Search ............. None
See application file for complete search history.

(56) References Cited

U.S. PATENT DOCUMENTS

| | | | |
|---|---|---|---|
| 4,748,419 A | | 5/1988 | Somerville |
| 5,627,460 A | * | 5/1997 | Bazinet et al. ............. 323/288 |
| 5,808,455 A | * | 9/1998 | Schwartz et al. .......... 323/271 |
| 5,952,849 A | | 9/1999 | Haigh |
| 6,853,174 B1 | * | 2/2005 | Inn ............................ 323/285 |
| 6,861,826 B2 | * | 3/2005 | Lynch ......................... 323/224 |
| 6,903,578 B2 | | 6/2005 | Haigh et al. |
| 6,933,706 B2 | * | 8/2005 | Shih ........................... 323/222 |
| 7,176,663 B2 | * | 2/2007 | Takimoto et al. .......... 323/224 |

OTHER PUBLICATIONS

Balogh, Laszlo, "Design and Application Guide for High Speed MOSFET Gate Drive Circuits", Texas Instruments Incorporated, Dallas, TX, 2002.
National Semiconductor Corporation, "LM5107, 100V / 1.4A Peak Half Bridge Gate Driver," www.national.com, Mar. 2005.

* cited by examiner

Primary Examiner—N. Drew Richards
Assistant Examiner—An T. Luu
(74) Attorney, Agent, or Firm—Fish & Richardson P.C.

(57) ABSTRACT

High-performance low-power isolated bootstrapped gate drive apparatus and methods are disclosed for driving high-side and floating transistors. The gate drivers use edge-triggered capacitive-coupled inputs. The gate drivers may include detection and delay circuitry to facilitate zero-voltage-switching of the high side or floating transistor and providing more robust rejection of false triggering. A capacitively coupled differential input edge triggered gate driver provides exceptional immunity to false triggering. The gate drivers may be used in transformer coupled drive circuits using transformers that need only support coupled pulses wide enough to be recognized as an edge by the input circuit.

38 Claims, 8 Drawing Sheets

CAPACITIVELY COUPLED FLOATING GATE DRIVER

TECHNICAL FIELD

This invention relates to DC to DC power conversion, and more particularly to driving transistors in high-side applications.

BACKGROUND

Driving MOSFETs in high-side applications often requires some means for level-shifting the signal and withstanding high voltage. A wide variety of isolated and non-isolated high side gate drive techniques, including direct, level-shifting, and bootstrap drivers, are described in Balogh, *Design and Application Guide for High Speed MOSFET Gate Drive Circuits*, Texas Instruments 2002.

Figure 1:
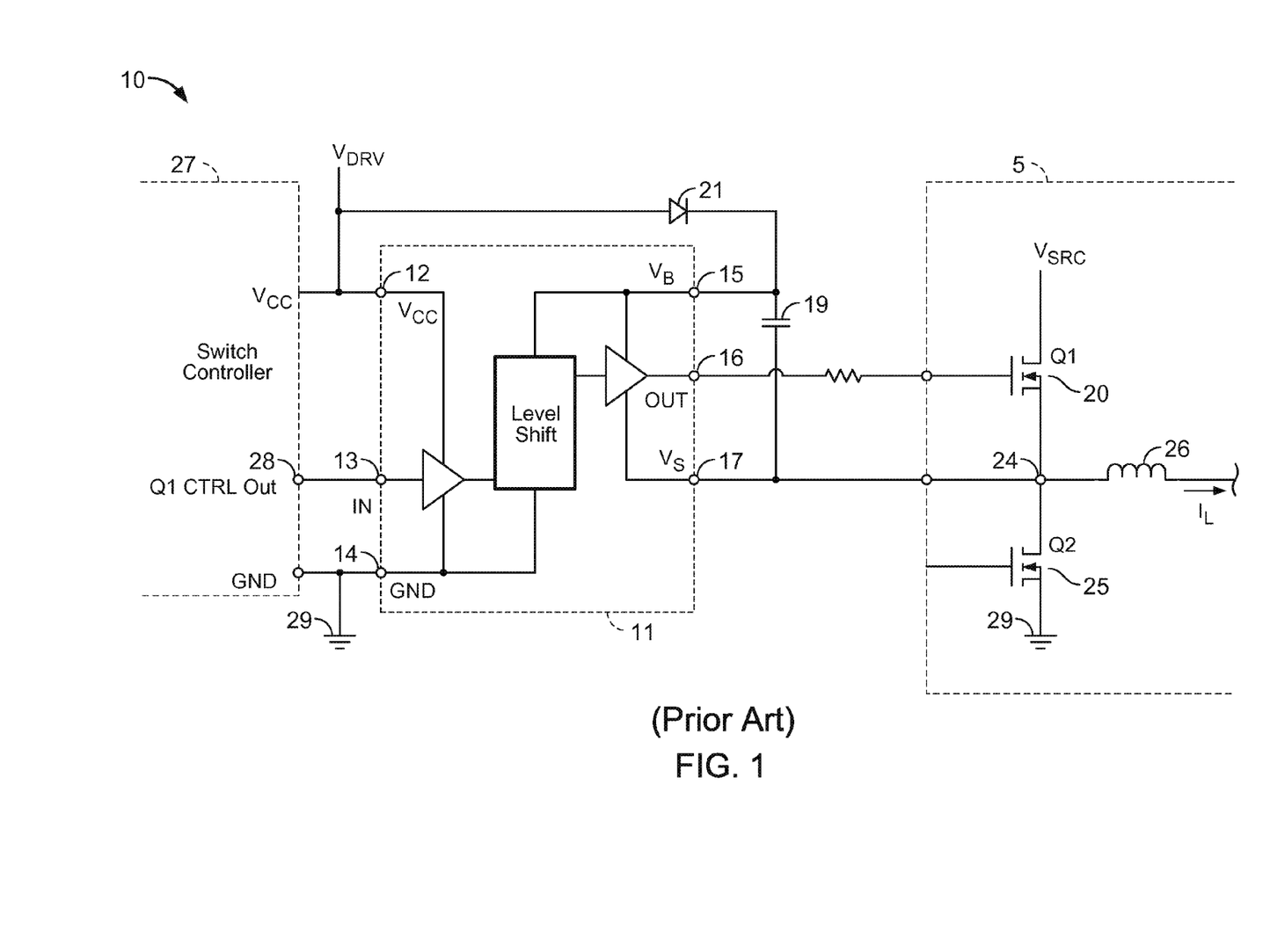
FIG. 1 shows a prior art ground-referenced high-side gate driver.

A prior art bootstrap high-side drive circuit 11 is shown in FIG. 1 connected to drive the gate of high-side transistor 20 in power conversion circuitry 5. The circuit 10 includes high side driver 11 having $V_{CC}$ connection 12, ground connection 14, input connection 13, output 16, bias connection 15 and source connection 17. Ground-referenced control signals output by the controller 27 at control output terminal 28 are received on the input 13 of the driver 11 which is also referenced to ground 29. The driver output 16 provides a turn ON pulse to the gate of transistor 20 referenced to the source output 17 which is connected to the transistor source terminal 24. A bootstrap bias circuit, including bias capacitor 19 and diode 21, provides energy to power the driver output stage. The bias capacitor 19 is charged through diode 21 when the source terminal 24 experiences negative-going voltage transitions. A level shifter translates the ground (29) referenced input signal 28 to a relatively high voltage control signal for use by the output stage.

Typically the transformers, high voltage integrated circuits, opto-couplers or discrete components added to provide the necessary drive to turn the transistor on or off increase the cost and size of the drive circuitry. Many solutions result in lower switching performance to provide the requisite impedance or isolation between the drive circuit and the transistor.

SUMMARY

In general, one aspect features a method including providing a gate driver with an input, an output for driving a control terminal of a switch, a power connection for receiving power to operate the gate driver, and a return for providing a return path for the power connection and the output. The method includes sensing an input signal relative to the return and sensing a variation between a node internal to the gate driver and a reference signal external to the gate driver. A decision whether to turn the switch ON may be executed based upon the input signal and the variation. The output connection may be driven relative to the return connection to turn the switch ON.

In general, another aspect features an apparatus including a gate driver having internal circuitry connected to an input, an output, a power connection, and a return. The internal circuitry is adapted to (i) sense an input signal relative to the return, (ii) sense a variation between a node internal to the gate driver and a reference signal external to the gate driver, (iii) drive the output relative to the return for driving a control terminal of a switch, (iv) execute a decision whether to turn the switch ON based upon the input signal and the variations, and (v) receive operating power via the power connection and the return.

Implementations of the method or apparatus may include one or more of the following features. The variation may comprise a rate of change of voltage between the node and the external reference signal. The decision may include waiting until the rate of change is less than a predetermined minimum. A DC blocking capacitor may be connected in series with the input. A control circuit may be provided with an output connected in series with the DC blocking capacitor and referenced to the reference signal. The control circuit may provide a first control signal to turn the switch ON and a second control signal to turn the switch OFF. The node may be connected to the input, a bias source may be connected to the node, and the variation may comprise a voltage or current at the node. The variation may include a rate of change of voltage between the node and the reference signal. The decision may include waiting for the rate of change to fall below a predetermined minimum before turning the switch ON. A MOSFET may be provided with a gate connected to the output and a source or a drain connected to the return. The reference signal may be a ground reference and the return connection may float with respect to the ground reference. The input sensing may include sensing a transition in the input signal and the deciding may be based upon the transition. The input signal may include a transition having a polarity, the internal circuitry may be adapted to sense the transition, and the decision may be based upon the transition. The decision may include sensing a first transition polarity to turn the switch ON and a second transition polarity to turn the switch OFF in a system where turning the switch from OFF to ON causes a first voltage transition at the return and turning the switch from ON to OFF causes a second voltage transition at the return, and the first transition polarity may be set to the opposite of the polarity of the first voltage transition and the second transition polarity may be set to the opposite of the polarity of the second voltage transition. The input may include first and second inputs and the input sensing may include sensing a first input signal and a second input signal respectively at the first and second inputs relative to the return connection, the first and second input signals may include a transition, and the decision may be based upon sensing a first transition in the first input signal and a second opposite transition in the second input signal. The input may include first and second inputs, the input signal may include first and second input signals including a transition; and the decision may be based upon sensing a first transition in the first input signal and a second opposite polarity transition in the second input signal. A DC blocking capacitance may be provided between first node and the reference and the variation sensing may include sensing a signal at the node. The variation sensing may include providing a DC blocking capacitance connected between the node and the reference, providing a bias source connected to the node, and sensing the voltage or current at the first node. The decision may include waiting a predetermined delay before turning the switch ON. A mechanism for selectively adjusting or disabling the predetermined delay may be provided. A control circuit with a ground referenced output may provide a first control signal to turn the switch ON and a second control signal to turn the switch OFF. Transformer coupling may be provided between the control circuit output and the gate driver input and a DC blocking capacitor may be connected in series between the transformer coupling and the gate driver input. A control circuit with a ground referenced output may provide a first control signal to turn the switch ON and a second control signal to turn the switch OFF, a transformer may be connected between the output of the control circuit and the driver input; and a DC blocking capacitor may be connected in series between the transformer and the driver input.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 2:
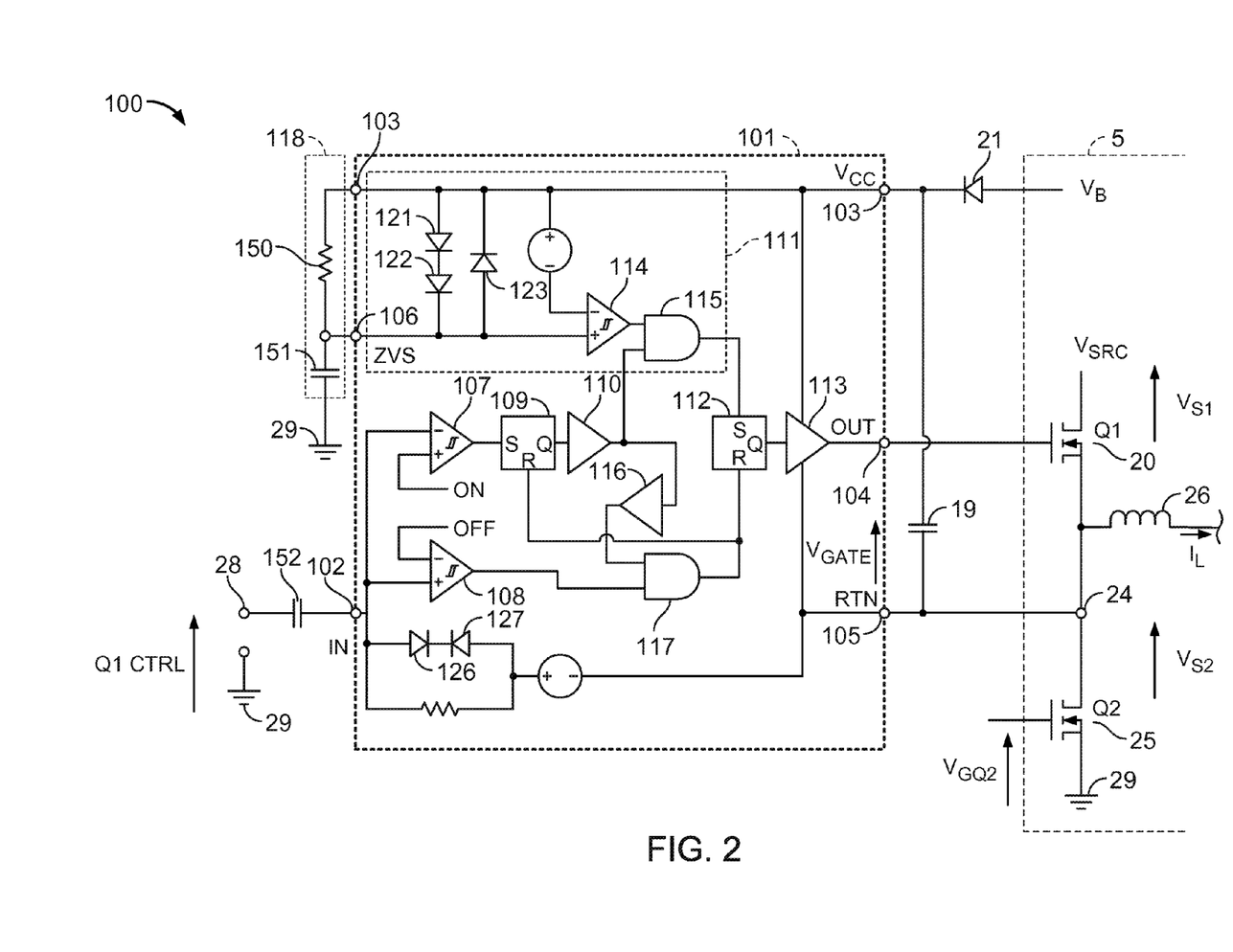
FIG. 2 shows a high-side gate driver with ZVS control connected to power conversion circuitry.

Referring to FIG. 2, capacitively-coupled floating gate drive circuitry 100 with control circuitry for zero voltage switching ("ZVS") is shown having an input 28 for receiving a gate drive control signal, Q1 CTRL, and an output 104 connected to drive the gate of high-side switch Q1 20 in power conversion circuitry 5. The terms "floats" and "floating" are used herein to describe a node that is not tied to a reference voltage such as ground. (The power conversion circuitry 5 shown in the examples may be a ZVS Buck-Boost Power Converter of the type described in Vinciarelli, Buck-Boost DC-DC Switching Power Conversion, U.S. Pat. No. 6,788,033, issued Sep. 7, 2004, assigned to VLT, Inc., incorporated here by reference.) In the power conversion circuitry 5, the drain of the high-side switch 20 is connected to a power input and the source is connected to node 24. Node 24 transitions between the input voltage, $V_{SRC}$, and the ground 29 of the power conversion circuitry 5 during circuit operation depending upon the state of switches 20 and 25. Node 24 therefore floats during operation of the power conversion circuitry. A switch controller (27 in FIG. 1, not shown in FIG. 2) having a ground-(29)-referenced output 28 is connected to the input 28 of the drive circuitry 100 for turning switch 20 ON and OFF. The switch controller 27 may also drive the ground-referenced switch Q2 25 directly.

Although it may be preferable for a variety of reasons, a ground referenced output is not necessary to drive the input of the drive circuitry 100.

Most, if not all, of the gate drive circuitry 100 may be integrated into a single gate driver device. For example, a five terminal gate driver device 101 is shown in FIG. 2 incorporating most of the gate drive circuitry 100. The gate driver 101 is shown having a control input terminal 102, an output terminal 104, a power input terminal 103 (shown in two places in FIG. 2), a power return terminal 105, and a ZVS terminal 106. (Although shown exiting the driver 101 in two places in FIG. 2, the power input terminal 103 is intended to be a single terminal in the physical device.) The gate drive circuitry may include a bootstrap bias circuit (shown external to the driver 101), including rectifier 21 and capacitor 19, to provide power to operate the drive circuitry. The output 104 may be connected directly to the gate of switch 20 as shown in FIG. 2. The power return 105 may be connected to the source of switch 20 which transitions with node 24 between $V_{SRC}$ and ground during circuit operation. The gate drive circuitry 100 also includes a ZVS capacitor 151 connected between the ZVS input 106 and ground 29 and a ZVS resistor 150 connected between the $V_{CC}$ input 103 and the ZVS input 106.

The input 28 of the drive circuitry 100 is capacitively coupled to the input 102 of the gate driver 101. Capacitor 152, which is used to block DC current, may be very small, e.g. 10 pF. Edge trigger circuitry is provided to detect the transitions of the control signal input. The inverting input of ON comparator 107 is connected to input 102, the non-inverting input is connected to an ON threshold reference, and the output is connected to the set input of control Flip-Flop 109. The Q output of control Flip-Flop 109 is connected to the control delay gate 110 which inserts a small delay (e.g. 4 ns) in the propagation of the signal. The drive circuit shown in FIG. 2 includes a ZVS circuit 111 (described in more detail below) which delays turning ON switch 20 until the voltage across the switch reaches a minimum. The control delay gate provides a small delay to allow the ZVS circuit time to react to the changing switch conditions. The output of the control delay gate 110 is input to AND gate 115 (which prevents the signal from propagating further until the ZVS criteria are satisfied). The output of AND gate 115 is connected to the set input of gate Flip-Flop 112 the Q output of which is connected to the output driver 113. Driver 113 drives the output 104 high with respect to the power return 105 when the gate Flip-Flop is set turning switch 20 ON.

When the input voltage falls below the ON threshold (e.g. with a high to low transition in the control signal), the output of ON comparator 107 goes high setting the control Flip-Flop 109 consequently triggering the control delay gate 110 which after a small delay provides a high output to AND gate 115 which sets gate Flip-Flop 112 and turns switch 20 ON after ZVS is detected.

Input 102 is also connected to the non-inverting input of OFF comparator 108. The inverting input is connected to an OFF threshold reference and the output of OFF comparator 108 is connected to an input of AND gate 117. The output of AND gate 117 is connected to the reset input of gate Flip-Flop 112 and the reset input of control Flip-Flop 109. A second input to AND gate 117 is connected to the output of reset delay gate 116. The input of reset delay gate 116 is driven by the output of the control delay gate 110 discussed above. The reset delay gate 116 inserts a small (e.g. 8 ns) propagation delay into the signal path to provide some immunity to false turn-OFF signal caused by ringing on node 24 during the turn ON of switch 20 (discussed in more detail below). When the input voltage rises above the OFF threshold (e.g. with low to high transition of the control signal), the output of OFF comparator 108 goes high resetting the control Flip-Flop 109 and the gate Flip-Flop 112 turning switch 20 OFF.

Clamp circuitry such as diodes 126, 127 and 121, 122, 123 may be provided on the input 102 and ZVS 106 terminals. An OR gate (not shown) may be added at the output of AND gate 117 to provide an input for a reset signal or an under voltage lockout signal which may be sent to reset the gate 112 and control 109 Flip-Flops to turn switch 20 OFF or keep it OFF.

Waveforms for the circuit 100 and power conversion circuitry 5 of FIG. 2 are shown in FIGS. 10A-10D and 9A-9I. The waveforms of FIGS. 10A-10D show operation of the circuit including a turn ON transition and a turn OFF transition of switch 20 on a 20 ns/Div time scale. The time scale for the waveforms of FIGS. 9A-9I is 2 ns/div and show waveforms for the circuit during the OFF to ON transition of switch 20.

Figure 9A:
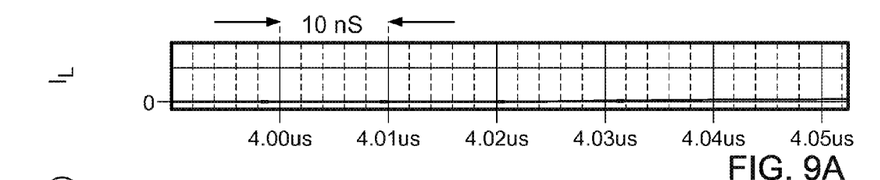
FIGS. 9A-9I show waveforms for the circuit of FIG. 2.
Figure 9B:
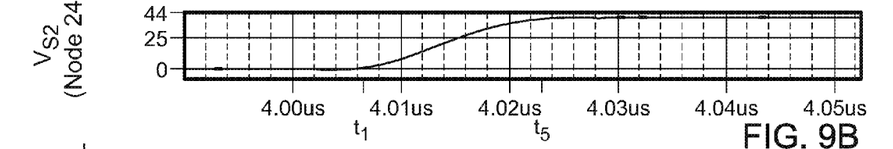
Figure 9C:
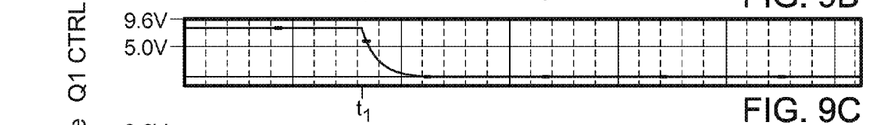
Figure 9D:
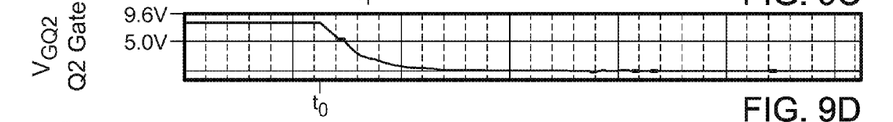
Figure 9E:
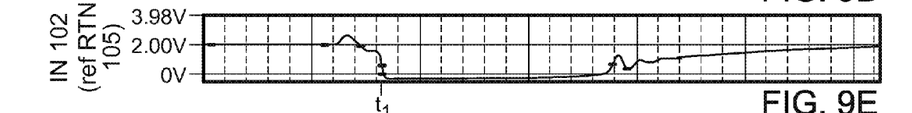
Figure 9F:
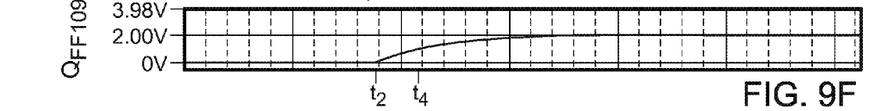
Figure 9G:
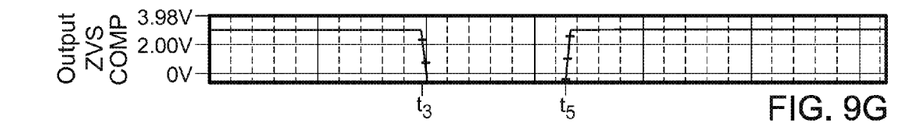
Figure 10A:
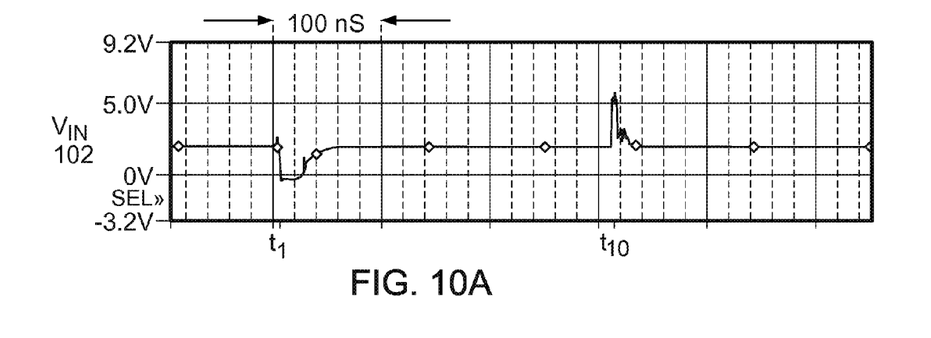
FIGS. 10A-10D show waveforms for the circuit of FIG. 2.
Figure 10B:
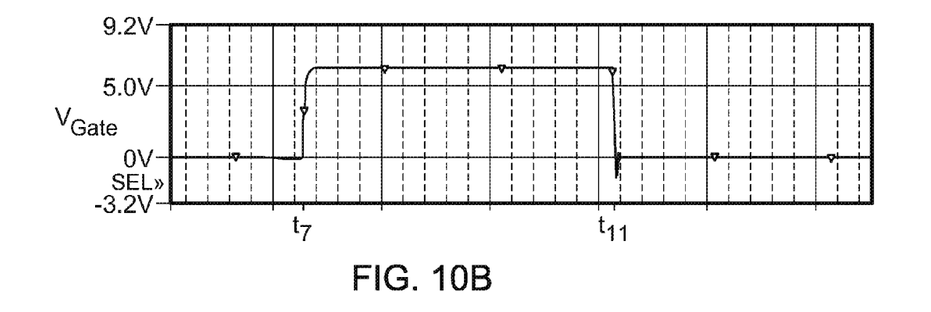
Figure 10C:
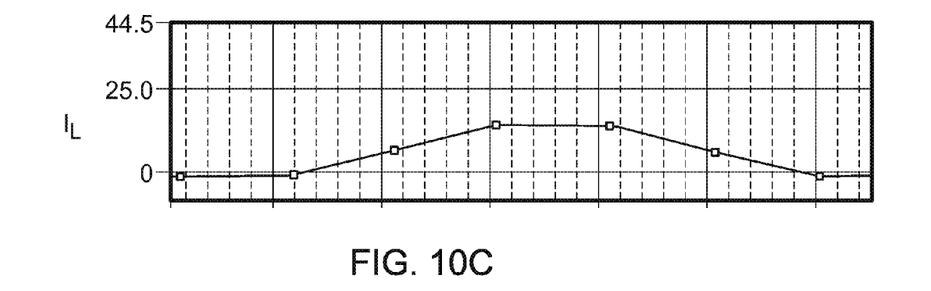
Figure 10D:
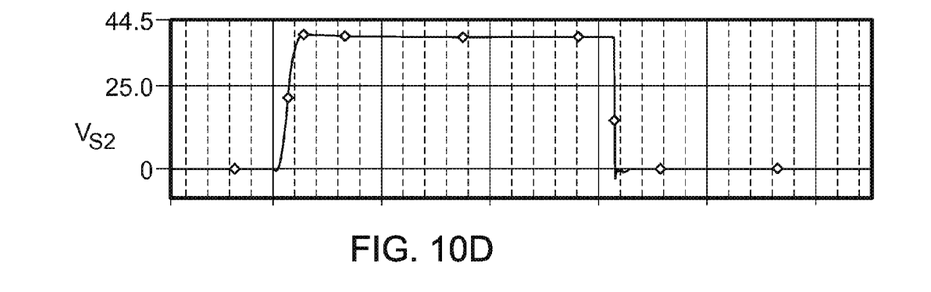

Just before the start of a new conversion cycle in the buck-boost power conversion circuitry 5, switch 25 is ON, switch 20 is OFF, and a negative current (FIGS. 9A, 10C) flows in inductor 26, i.e. in a direction towards node 24. At time $t_0$, switch controller 27 turns switch 25 OFF (as shown in FIG. 9D by the falling gate drive voltage, $V_{GQ2}$, for Q2 switch 25) and keeps switch 20 OFF initiating a ZVS interval during which the capacitances associated with node 24 are charged by the negative inductor current as shown in FIGS. 9B, 10D by the rising voltage, $V_{S2}$, at node 24. In the ZVS example provided, switch 20 may be turned ON at or after the time that voltage, $V_{S2}$, reaches a maximum, preferably equal to $V_{SRC}$ to minimize switching losses. The gate drive circuitry 100 includes ZVS circuitry that relaxes the timing constraints on the controller. To turn switch 20 ON, switch controller 27 (FIG. 1) provides a high-to-low transition at the input 28 of the driver circuitry 100 as shown at time $t_1$ in FIG. 9C (Q1 CTRL) causing the voltage at the input terminal 102 of driver 101 to drop relative to the power return terminal 105 as shown in FIGS. 9E, 10A. As the voltage at input terminal 102 drops below the ON threshold, the output of the ON comparator 107 goes high setting control Flip-Flop 109 and providing a high signal at the input of control delay gate 110. The control delay gate function may be implemented using an RC time constant at the Q output of the control Flip-Flop 109 as shown in the simulation waveforms. The waveform of FIG. 9F consequently shows the Q output of the control Flip-Flop 109 (Q FF109) rising slowly beginning at time $t_2$. At time, $t_4$, the Q output crosses the threshold for the logic high state providing a delay of about 4 ns, which is sufficient to allow the ZVS circuit 111 to react to the changing voltage at node 24. Referring to FIG. 9G, the output of ZVS comparator 114 becomes valid after the transition at time, $t_3$, to the low state indicating that the switch voltage (across switch 20) is changing and has not yet reached a minimum.

The ZVS circuit 111 senses the slope of the changes in the voltage, $V_{S2}$, at node 24 using ZVS network 118. The voltage at the ZVS input 106, connected to the non-inverting input of ZVS comparator 114, approximates $V_{CC}$ under steady state conditions but lags changes in $V_{CC}$ due to the time constant of the ground-referenced ZVS capacitor 151 and ZVS resistor 150 (ZVS network 118). The inverting input is connected to a ZVS reference, which like all of the other circuitry in the driver 1001 is referenced to the return terminal 105 (through $V_{CC}$ capacitor 19) and floating node 24. As the voltage, $V_{S2}$, at node 24 rises, the voltage at the $V_{CC}$ terminal rises commensurately due to the bootstrap capacitor 19 connected between $V_{CC}$ 103 and return 105. Because the voltage at the ZVS input 106 lags behind the rising $V_{CC}$ 103 and return 105 voltages, the non-inverting input drops below the ZVS reference threshold causing the ZVS comparator output to go low at time $t_3$ in FIG. 9G.

The voltage $V_{S2}$ at node 24 reaches a maximum and the rate of change of $V_{S2}$ declines toward zero at time $t_5$ as shown in FIG. 9B corresponding to a minimum voltage across switch 20. As the rate of change of $V_{S2}$, i.e., the slope, falls off toward zero, the voltage at the ZVS input 106 catches up with $V_{CC}$, exceeds the ZVS reference threshold, and causes the output of the ZVS comparator 114 to go high at time $t_5$ as shown in FIG. 9G. In practice the circuit may be set up to switch at a slope greater than zero to account for inherent switching delays in the driver. The high signal indicates that the voltage across switch 20 has reached a minimum for ZVS operation.

By using the slope of the $V_{S2}$ waveform, the ZVS circuit is able to time the turn-ON of switch 20 over a wide range of inductor currents and input voltages. If the inductor initially has more energy than what is required to raise $V_{S2}$ to the input voltage level corresponding to zero voltage across switch 20, the body diode of switch 20 will clamp $V_{S2}$ just above the input voltage ($V_{SRC}$). When $V_{S2}$ stops rising the circuit will detect the peak in $V_{S2}$ (i.e. the minimum in voltage across switch 20) and turn switch 20 ON. If the inductor initially has less energy than required to raise $V_{S2}$ to the input voltage, $V_{S2}$ would be capable of ringing up to some level below the input voltage and would then begin to fall. The driver will detect the slope of the rising $V_{S2}$ approaching zero and turn switch 20 ON at or near the peak of $V_{S2}$ corresponding to the minimum voltage across switch 20.

Figure 9H:
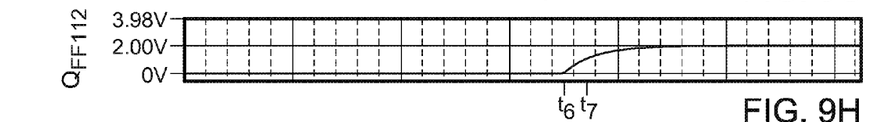
Figure 9I:
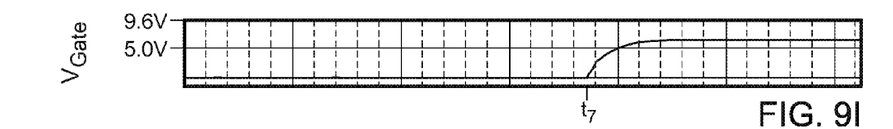

The high signal at the output of the ZVS comparator after time $t_5$ allows the control Flip-Flop signal to propagate through AND gate 115 to set the gate Flip-Flop 112 at time $t_6$ as shown in FIG. 9H. When the Q output of the gate Flip-Flop reaches a logic high state (at time $t_7$), output amplifier 113 drives the output 104 high (as shown in FIGS. 9I, 10B) turning switch 20 ON shortly thereafter.

To turn switch 20 OFF, switch controller 27 (FIG. 1) provides a low-to-high transition at the input 28 of the driver circuitry 100 as shown in FIG. 10A at time $t_{10}$. As the input voltage rises above the OFF threshold, the output of OFF comparator 108 goes high resetting the control Flip-Flop 109 and the gate Flip-Flop 112, immediately forcing the output 104 low and turning switch 20 OFF as shown in FIG. 10B at time $t_{11}$.

The polarities of the control signal transitions have been chosen to provide positive feedback in the drive circuitry 100. The input comparators 107 and 108 are referenced to the power return terminal 105 which causes the output voltage of the switch controller 27 (FIG. 1) to appear to be falling as the voltage rises at node 24 (e.g. in response to turning switch 20 ON) and vice versa (e.g. in response to the turning switch 20 OFF). Therefore, the negative transition control signal may be used to turn switch 20 ON and the positive transition control signal may be used to turn switch 20 OFF providing regenerative positive feedback. The effects of the positive feedback on the input voltage are illustrated in the simulations of FIGS. 10A and 10D. The voltage at input 102 stays low throughout the relatively long (20 ns) rise in $V_{S2}$ and remains high for the much shorter duration of the fall of $V_{S2}$.

In some applications, the rising voltage at node 24 (occurring with the turn OFF of switch 25 during ZVS operation) may be sufficient to trigger the ON comparator 107 providing the fastest ZVS turn ON of switch 20 without input from the controller 27 which would then only need to bring the Q1 CTRL input low in time to make a positive transition to turn OFF switch 20. In situations where the inductor current is not sufficiently negative (during the turn OFF of switch 25) such as during start up, the controller must assert Q1 CTRL to turn ON switch 20.

In a converter that has sufficiently high parasitic inductances, the voltage, $V_{S2}$, at node 24 may overshoot the source voltage, $V_{SRC}$, by several volts as $V_{S2}$ rises towards $V_{SRC}$ following the turn OFF of switch 25 or turn ON of switch 20. The recovery of $V_{S2}$ down to $V_{SRC}$ following the overshoot may appear as low-to-high transition at the input terminal 102 of the driver 101, which if acted upon, could result in prematurely turning switch 20 OFF. Similarly, $V_{S2}$ may overshoot ground 29 in the negative transition following the turn OFF of switch 20 and the corresponding recovery back up to ground may be misinterpreted as a turn-ON signal by the driver. Thus overshoot or ringing on node 24 could cause false triggering of the driver circuitry. The reset delay gate 116 delays propagation of the ON signal from the Q output of control Flip-Flop 109 to AND gate 117. As a result, an OFF signal from OFF comparator 108 may not propagate to reset the Flip-Flops 109 or 112 until after the ON signal is presented to AND gate 117. The combined delay of the reset delay gate 116 and the control delay gate 110 may be set to provide a window that encompasses the time during which ringing on node 24 occurs when switch 25 is turned OFF, preventing any ringing during the window from falsely triggering the driver 101 and thus offering a level of protection against premature turn-off of switch 20.

The input capacitor 152, ZVS capacitor 151, and ZVS resistor 150 are shown external to the driver 101 allowing their values to be chosen independently for each application. The input capacitor 152 performs a digital function and may be chosen for a robust signal. The ZVS capacitor 151 and resistor 150 perform the analog differentiation function ($I_R = C\, d_{VS2}/dt$). Their values may be chosen to adjust the slope at which the voltage across the ZVS resistor 150 will equal the ZVS reference threshold. Although, shown external to the gate driver device 101 in FIG. 2, the input capacitor 152 and ZVS capacitor 151 may be on the order of 10 pF allowing either or both to be integrated into the gate driver 101 or a printed circuit board carrying the driver 101.

Figure 3:
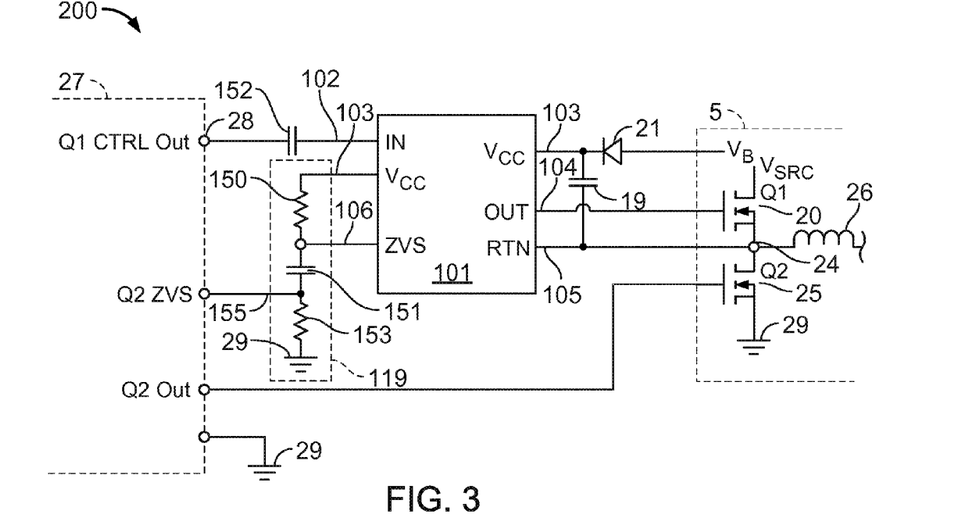
FIG. 3 shows the high-side gate driver with a modified ZVS network connected to power conversion circuitry.

Referring to FIG. 3, the gate driver 101 is shown connected with a modified ZVS network 119. A second ZVS resistor 153 has been added in the ZVS network 119 in series between the ZVS capacitor 151 and ground 29. The addition of the second ZVS resistor 153 provides a mechanism for switch controller 27 to sense the minimum in the voltage $V_{S2}$ at node 24 to turn switch 25 ON at the optimal time for ZVS operation. In operation, as the voltage $V_{S2}$ at node 24 falls, the voltage at $V_{CC}$ 103 follows (due to capacitor 19) and the current through the ZVS network 119 forces the potential at terminal 155 below ground 29. When $V_{S2}$ falls below ground it is clamped by the body diode of switch 25. As the ZVS capacitor 151 discharges to the lower $V_{CC}$ voltage, the capacitor current decays to zero and the voltage at node 155 rises signaling to the switch controller that the voltage, $V_{S2}$, across switch 25 has reached a minimum and may be turned ON. The switch controller 27 may include an internal mechanism (e.g. a delay at least equal to the propagation delay from when the controller raises Q1 CTRL output to when switch 20 turns OFF) to avoid sensing the signal at node 155 before it is a valid indication of the ZVS status. Alternatively, the controller may sense the DC voltage at node 24 to prevent turning switch 25 ON before switch 20 turns OFF.

Figure 4A:
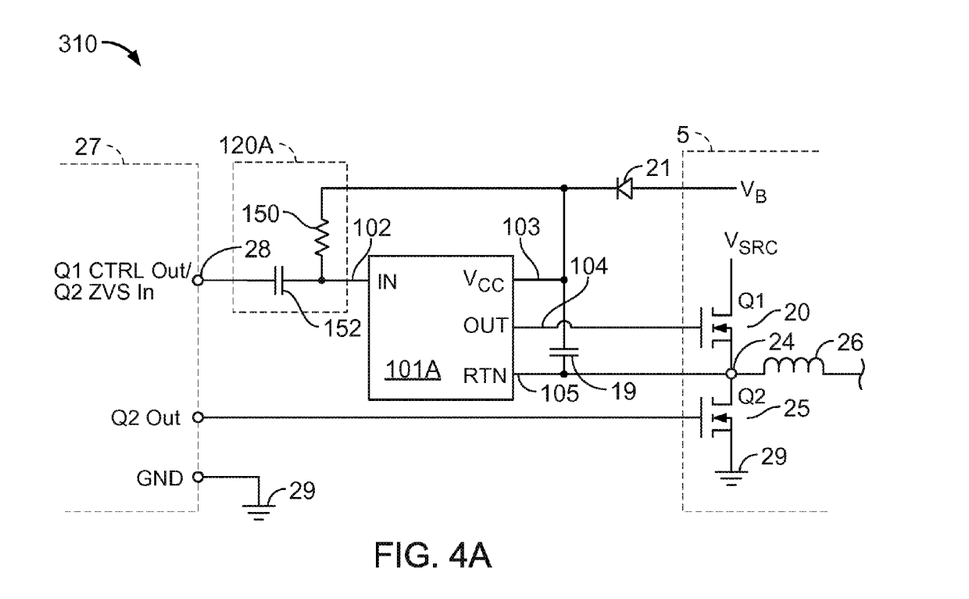
FIG. 4A shows a high-side gate driver connected as a four terminal device with a modified ZVS network to power conversion circuitry.

Referring to FIG. 4A, a four terminal gate driver 10A is shown connected with a modified ZVS network 120A. The four terminal gate driver 101A in FIG. 4A may comprise a five terminal gate driver such as driver 101 in FIGS. 2 and 3 with the ZVS 106 and IN 102 terminals connected together and the ZVS threshold and/or the ON and OFF thresholds modified to work together. Operation of the four terminal implementation is similar to the five terminal device discussed above except that both of the input signal and the ZVS signals are coupled through capacitor 152 which now serves as the input capacitor and the ZVS capacitor. The value of capacitor 152 may be chosen to provide a robust control signal for the input and the value of the ZVS resistor 150 may be chosen to provide the proper ZVS threshold. As discussed above, the controller 27 pulls the input terminal 28 to the drive circuitry 101A low (to ground 29 potential) to turn ON switch 20 (FIG. 9C). The terminal 28 side of capacitor 152 therefore will be tied to ground 29 throughout the ON cycle of switch 25. Referring to FIG. 2, capacitor 152 in FIG. 4A will therefore function the same as ZVS capacitor 151 during the turn ON of switch 20.

Capacitor 152 also contains the ZVS information for switch 25 which may be derived within the controller 27 by sensing the current through capacitor 152. For example, the controller 27 may include a resistance in series with the terminal 28 analogous to ZVS resistor 153 in FIG. 3. When the current decays to zero or close to zero, the controller 27 may turn ON switch 25 under ZVS conditions. This implementation eliminates several external components (e.g. capacitor 151 and resistor 153) and a pin on the controller 27 (e.g. terminal 155 in FIG. 3) and a pin in the driver 101A (e.g. ZVS terminal 106 in FIGS. 2, 3).

Figure 4B:
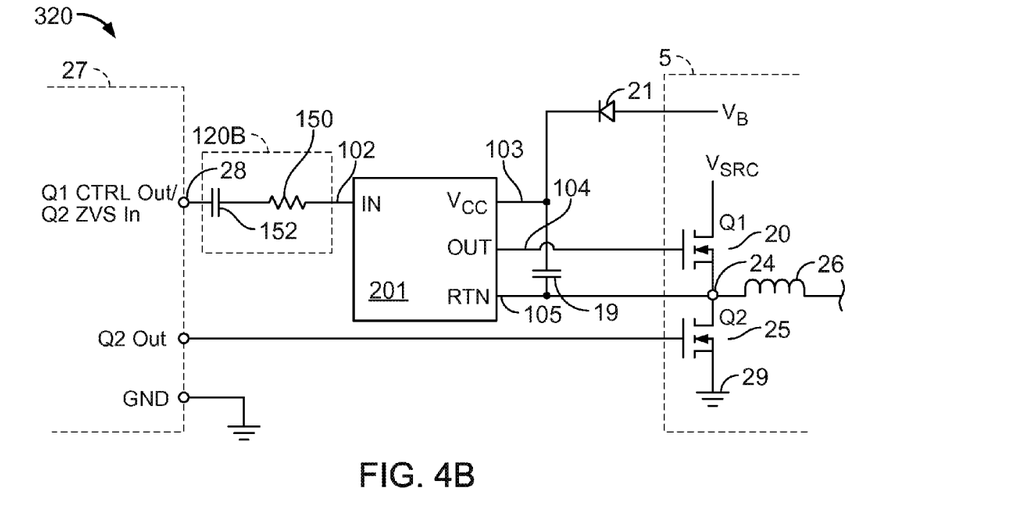
FIG. 4B shows a four-terminal high-side gate driver connected with an alternate modified ZVS network.
Figure 5:
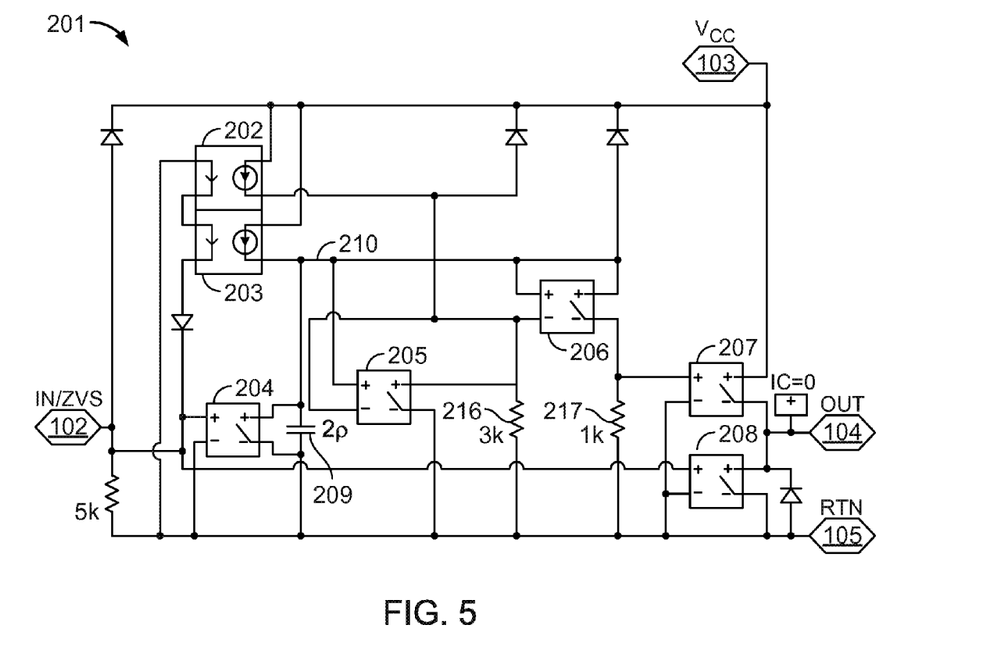
FIG. 5 shows a functional block diagram and implementation of an alternate four-terminal high-side gate driver with ZVS control.

An alternate modified ZVS network 120B is shown connected to a four terminal gate driver 201 in the circuit 320 of FIG. 4B. FIG. 5 shows an alternate implementation of a four terminal gate driver 201. Operation of the driver 201 will be described with reference to FIGS. 5 and 4B with the assumption that all internal control nodes are at zero volts with respect to the return terminal 105, switches 207 and 208 are OFF, and the output 104 is held low by the input capacitance of switch 20 at the beginning of a switch cycle. The controller 27 (FIG. 4B) may begin a new switching cycle in the power conversion circuitry 5 by pulling the input pin 28 (FIG. 4B) low to turn switch 20 ON. As a result, the input pin 102 is initially pulled below the return pin 105 drawing an input current through current mirrors 202 and 203. The output nodes of current mirrors 202 and 203 will rise as a result. The rate of rise in voltage at node 210 (at the output of mirror 203) however is decreased by capacitor 209. Switches 205 and 206 remain OFF until after the output of current mirror 202 drops sufficiently below the threshold set at node 210 by capacitor 209. The dual function input-ZVS terminal 102 will remain low with respect to the return terminal 105 until the slope of the rising voltage at node 24 declines to a sufficiently low level and the displacement current through capacitor 152 is reduced indicating that the voltage at node 24 has reached or is approaching a maximum.

As the input-ZVS terminal approaches the return terminal 105, the output current from mirrors 202 and 203 diminishes. The output voltage of mirror 202 begins to fall due to the load provided by resistor 216. Capacitor 209 however, holds up the output voltage of mirror 203 (node 210) turning switches 205 and 206 ON, consequently turning switch 207 ON. Switch 205 enhances the turn-on of switch 206. When ON, switch 207 pulls the output terminal 104 high to turn ON switch 20. As capacitor 209 discharges through switch 206 and resistor 217, switch 207 turns OFF. Resistor 217 is appropriately scaled with capacitor 209 to provide sufficient time for switch 20 to turn ON. Switch 20 remains ON thereafter due to the input capacitance of switch 20.

To turn switch 20 OFF, the controller 27 may pull the input 28 high causing the input-ZVS pin 102 to go high relative to the return terminal 105. The high voltage at the input-ZVS terminal 102 turns switch 208 ON discharging the input capacitance of switch 20 turning switch 20 OFF, and turns switch 204 ON discharging capacitance 209. As the voltage at node 24 falls, the input-ZVS pin 102 remains high (due to capacitor 152) keeping switch 208 ON and switch 20 OFF.

Figure 6:
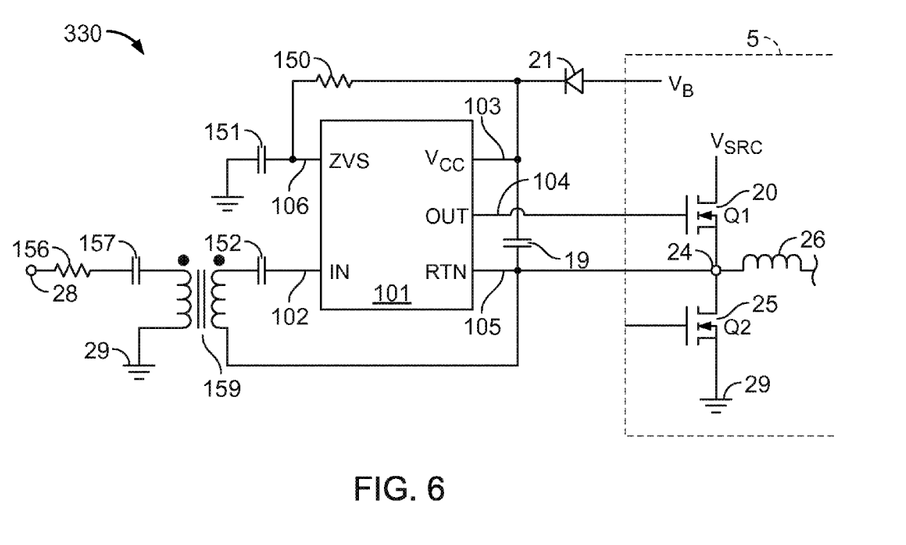
FIG. 6 shows the high-side gate driver with ZVS control with a transformer coupled input.

Referring to FIG. 6, a transformer-coupled drive circuit 330 is shown using a pulse transformer to drive the input pin 102 of the driver circuit 101. The transformer secondary is connected across the input 102 and the return 105 providing level translation of the input signal and providing exceptional immunity to false triggering due to overshoot or ringing on node 24. Resistor 156, capacitor 157, and the primary inductance of transformer 159 may shape pulses from the edges of the Q1 drive signal from controller 27 (FIG. 2). The input capacitor 152 allows for a DC offset between the input terminal 102 and the return terminal 105. Because the driver 101 is edge triggered, the transformer need only support signal pulses wide enough to be recognized by the input pin 102 providing an advantage over competing solutions that require the transformer to support the full volt-second product of the input signal for the entire duration of the ON or OFF pulse. As a result, the transformer coupled solution in FIG. 6 results in a smaller transformer than many competing transformer coupled solutions.

Figure 7:
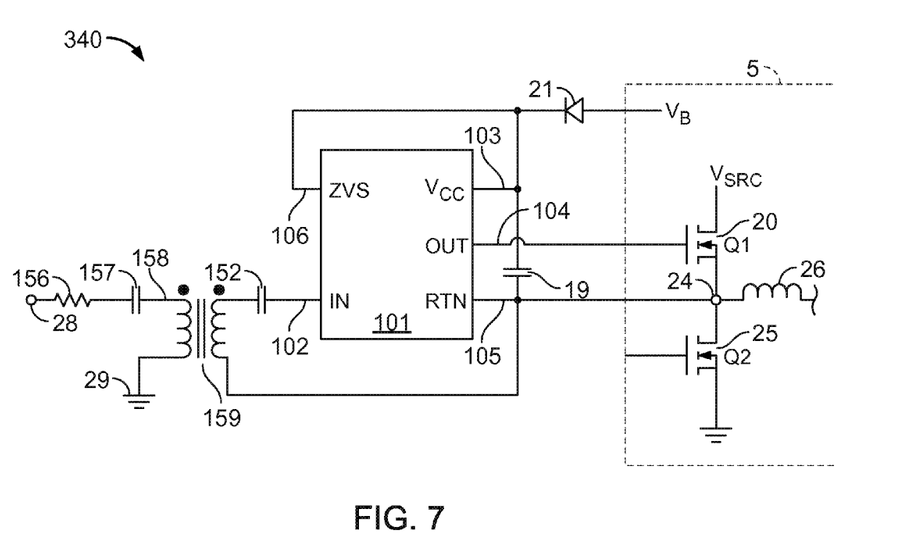
FIG. 7 shows the high-side gate driver with the ZVS control disabled using a transformer coupled input.

The ZVS circuitry of circuit 330 operates in the same manner described above in connection with the drive circuit 100 of FIG. 2. The ZVS function of driver 101 may be disabled by connecting the ZVS pin to $V_{CC}$ as shown in the circuit 340 of FIG. 7. Although a transformer coupled arrangement is shown in FIG. 7, the ZVS function may also be disabled in the capacitively-coupled embodiment of FIG. 2 by eliminating the ZVS resistor 150 and ZVS capacitor 151 (FIG. 2) and connecting the ZVS terminal 106 to the $V_{cc}$ terminal 103. With the ZVS disabled, any delay associated with the ZVS comparator is eliminated to allow for faster turn-on of the driver output 104 which may be valuable in applications that do not operate with ZVS, such as a buck converter operating in continuous conduction mode, or where the ZVS transition of switch 20 is so quick that the additional delay presented by the ZVS circuit is not required.

Figure 8:
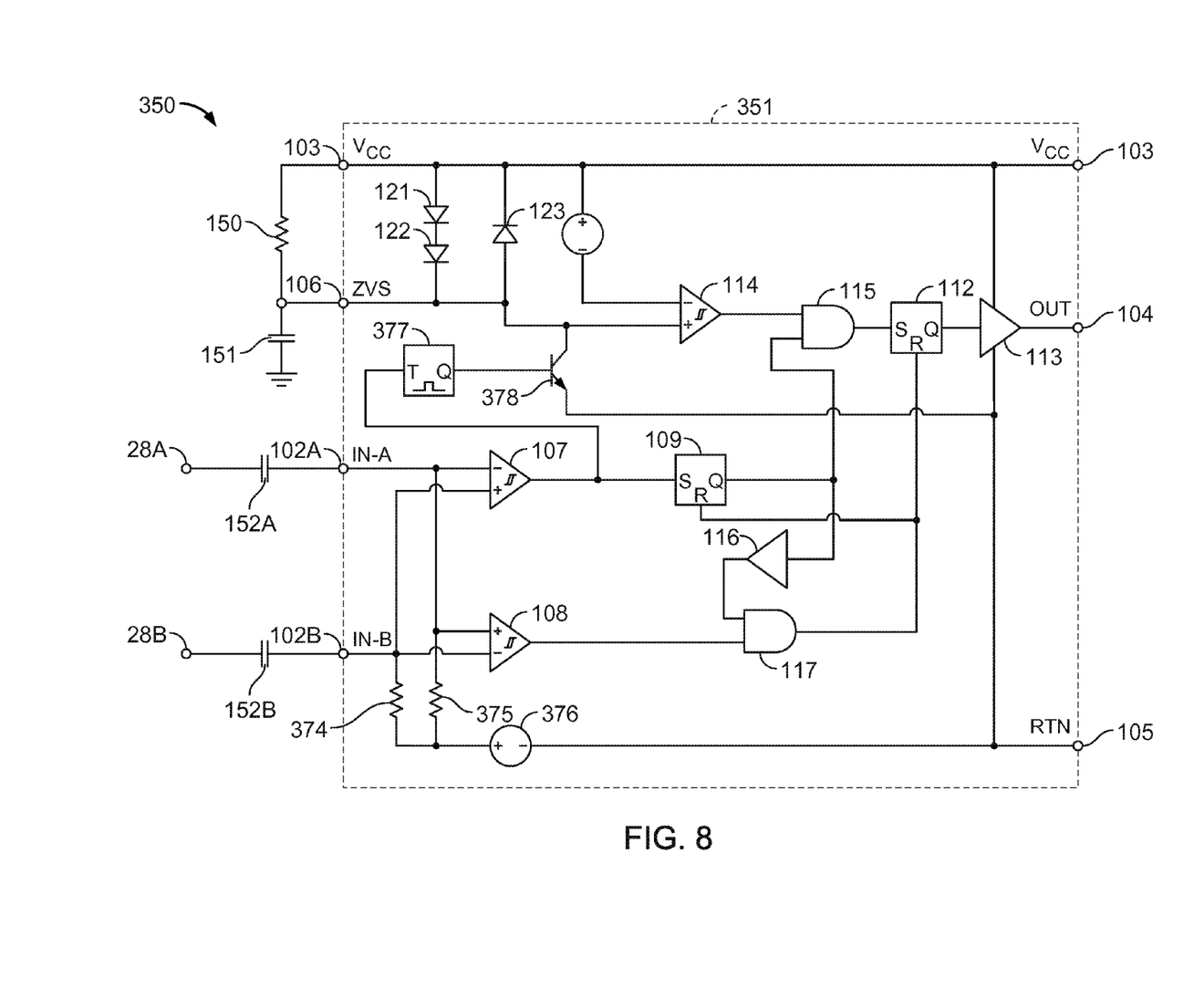
FIG. 8 shows a high-side gate driver with ZVS control and having differential edge-triggered inputs.

Gate drive circuitry 350 shown in FIG. 8 includes a modified gate driver 351 in which the susceptibility to noise or ringing on node 24 is dramatically reduced. Rather than a single input 28 coupled to input terminal 102 as shown in FIGS. 2 and 3, the drive circuitry 350 has two inputs 28A and 28B respectively connected via capacitors 152A and 152B to input terminals 102A and 102B of gate driver 351. Input terminal 102A is connected to the inverting input of ON comparator 107 and the non-inverting input of OFF comparator 108. Input terminal 102B is connected to the non-inverting input of ON comparator 107 and the inverting input of OFF comparator 108. Most of the circuitry is the same as in driver 101 and similar reference designations are therefore used in FIG. 8 for components in driver 351 that serve the same function as in driver 101. The bias circuitry in FIG. 8 (resistors 374 and 375 and voltage source 376) has been modified to provide the same bias voltage (e.g. ½ $V_{CC}$) to each input of the ON and OFF comparators 107 and 108. Although not shown in FIG. 8, clamp circuitry may be used on each input 102A and 102B to clamp the input to a range between $V_{CC}$ 103 and return 105. The ZVS circuitry is similar except that a mono-stable multi-vibrator 377 and transistor 378 are added and the control delay gate 110 are removed in FIG. 8. In operation when the ON comparator goes high, the Q output of one shot 377 goes high for fixed duration e.g., 10-20 ns, turning transistor 378 ON and clamping the ZVS input to the level determined by the forward voltage drop diodes 121 and 122. While the clamp is active, the ZVS comparator output is forced low preventing output 104 from going high. The one shot duration is set long enough to ensure that the voltage at node 24 begins to rise before the clamp is released. The clamp serves a similar function to the control delay gate 110 of FIG. 2.

The multi-vibrator 377 and transistor 378 provide flexibility that the delay block 110 (FIG. 2) did not provide. Because of external access through ZVS pin 106 the delay due to one shot 377 may be completely eliminated by shorting the ZVS pin 106 to the Vcc pin 103 and eliminating capacitor 151. (Transistor 378 may be current limited to a current value small compared to the normal Vcc current of the driver.) In addition in applications where ZVS detection is not required, but a fixed delay longer than that provided by 377 is required, a capacitor may be connected in parallel with resistor 150 to increase the delay.

To turn switch 20 ON, the controller 27 (FIGS. 1, 3, 4) creates a voltage differential between inputs 28A and 28B with input 28B being more positive. Conversely, to turn switch 20 OFF controller 27 must create an opposite voltage differential between inputs 28A and 28B with input 28A being more positive. The controller may drive the inputs with complementary signals to produce the necessary differential drive. For example, the controller may cause a high to low transition at input 28A and a low to high transition at input 28B to turn ON switch 20. To turn switch 20 OFF, the controller may cause a low to high transition at input 28A and a high to low transition at input 28B.

Although the inputs are capacitively coupled, any noise or ringing at node 24 equally affects both inputs of each comparator and therefore fails to introduce the differential voltage necessary to trigger the driver 351. Comparators 107 and 108 are provided with hysteresis to reject false triggering by common mode signals.

A number of embodiments of the invention have been described. Nevertheless, it will be understood that various modifications may be made without departing from the spirit and scope of the invention. Accordingly, other embodiments are within the scope of the following claims.

What is claimed is:

1. A method comprising:
   providing a gate driver having an input connection, an output connection for driving a control terminal of a switch, a power connection for receiving power to operate the gate driver, and a return connection for providing a return path for the power connection and the output connection;
   sensing relative to the return connection an input signal;
   sensing a variation between a first node internal to the gate driver and a reference signal external to the gate driver;
   executing a decision based upon the input signal and the variation whether to turn the switch ON;

driving the output connection relative to the return connection to turn the switch ON.

2. The method of claim 1 wherein the variation further comprises a rate of change of voltage between the first node and the external reference signal.

3. The method of claim 2 wherein executing the decision further comprises waiting until the rate of change is less than a predetermined minimum.

4. The method of claim 1 further comprising providing a DC blocking capacitor connected in series with the input connection.

5. The method of claim 4 further comprising providing a control circuit having an output connected in series with the DC blocking capacitor and referenced to the reference signal, wherein the control circuit is adapted to provide a first control signal to turn the switch ON and a second control signal to turn the switch OFF.

6. The method of claim 5 wherein the first node is connected to the input connection and
the sensing a variation further comprises providing a bias source connected to the first node, and the variation comprises a voltage or current at the first node.

7. The method of claim 5 wherein the variation further comprises a rate of change of voltage between the first node and the reference signal.

8. The method of claim 7 wherein executing the decision further comprises waiting for the rate of change to fall below a predetermined minimum before turning the switch ON.

9. The method of claim 1 wherein the switch comprises a MOSFET and further comprising:
providing the MOSFET having a gate connected to the output connection and having a source or a drain connected to the return connection.

10. The method of claim 9 wherein the reference signal is a ground reference and the return connection floats with respect to the ground reference.

11. The method of claim 1 wherein the input signal comprises a transition having a polarity, the sensing an input signal comprises sensing the transition in the input signal, and the decision is based upon the transition in the input signal.

12. The method of claim 11 wherein
turning the switch from OFF to ON causes a first voltage transition at the return connection and turning the switch from ON to OFF causes a second voltage transition at the return connection;
executing the decision comprises sensing a first transition polarity to turn the switch ON and a second transition polarity to turn the switch OFF; and
further comprising setting the first transition polarity to the opposite of the polarity of the first voltage transition and the second transition polarity to the opposite of the polarity of the second voltage transition.

13. The method of claim 1 wherein
the input connection comprises a first input connection and a second input connection;
the sensing an input signal further comprises sensing a first input signal and a second input signal respectively at the first and second input connections relative to the return connection, the first and second input signals comprising a transition; and
the decision is based upon sensing a first transition in the first input signal and a second transition in the second input signal, the second transition having a polarity opposite that of the first transition.

14. The method of claim 1 further comprising providing a DC blocking capacitance between the first node and the reference signal and the sensing a variation further comprises sensing a signal at the first node.

15. The method of claim 1 wherein the sensing a variation further comprises:
providing a DC blocking capacitance connected between the first node and the reference signal;
providing a bias source connected to the first node; and
sensing the voltage or current at the first node.

16. The method of claim 1 wherein executing the decision further comprises providing a predetermined delay before turning the switch ON.

17. The method of claim 16 further comprising providing a mechanism for selectively adjusting the predetermined delay.

18. The method of claim 16 further comprising providing a mechanism for selectively disabling the predetermined delay.

19. The method of claim 10 further comprising:
providing a control circuit having an output referenced to the ground reference, and adapted to provide a first control signal to turn the switch ON and a second control signal to turn the switch OFF;
providing transformer coupling between the output of the control circuit and the input connection; and
providing a DC blocking capacitor connected in series between the transformer coupling and the input connection.

20. Apparatus comprising:
a gate driver having internal circuitry connected to an input connection, an output connection, a power connection, and a return connection,
the internal circuitry being adapted to
(i) sense relative to the return connection an input signal,
(ii) sense a variation between a first node internal to the gate driver and a reference signal external to the gate driver,
(iii) drive the output connection relative to the return connection for driving a control terminal of a switch,
(iv) execute a decision whether to turn the switch ON based upon the input signal and the variation, and
(v) receive operating power via the power connection and the return connection.

21. The apparatus of claim 20 wherein the variation comprises a rate of change of voltage between the first node and the external reference signal.

22. The apparatus of claim 21 wherein executing the decision further comprises waiting until the rate of change is less than a predetermined minimum.

23. The apparatus of claim 20 further comprising a DC blocking capacitor connected in series with the input connection.

24. The apparatus of claim 23 further comprising:
a control circuit having an output referenced to the reference signal, the control circuit being adapted to provide a first control signal to turn the switch ON and a second control signal to turn the switch OFF;
the output of the control circuit being connected in series with the DC blocking capacitor.

25. The apparatus of claim 24 wherein the internal circuitry further comprises a bias source connected to the first node, wherein the variation comprises a variation in voltage or current at the first node, and wherein the first node is connected to the input connection.

26. The apparatus of claim 24 wherein the variation comprises a rate of change of voltage between the first node and the reference signal.

27. The apparatus of claim 26 wherein executing the decision further comprises waiting for the rate of change to fall below a predetermined minimum before turning the switch ON.

28. The apparatus of claim 20 wherein the switch comprises a MOSFET and further comprising the MOSFET having a gate connected to the output connection and having a source or a drain connected to the return connection.

29. The apparatus of claim 28 wherein the reference signal is a ground reference and the return connection floats with respect to the ground reference.

30. The apparatus of claim 20 wherein the input signal comprises a transition having a polarity, the internal circuitry is adapted to sense the transition in the input signal, and the decision is based upon the transition in the input signal.

31. The apparatus of claim 30 wherein
turning the switch from OFF to ON causes a first voltage transition at the return connection and turning the switch from ON to OFF causes a second voltage transition at the return connection;
executing the decision is based upon sensing a first transition polarity to turn the switch ON and a second transition polarity to turn the switch OFF; and
wherein the first transition polarity is opposite of the polarity of the first voltage transition and the second transition polarity is opposite of the polarity of the second voltage transition.

32. The apparatus of claim 20 wherein
the input connection comprises a first input connection and a second input connection;
the input signal further comprises a first input signal and a second input signal respectively at the first and second input connections relative to the return connection, the first and second input signals comprising a transition; and
the decision is based upon sensing a first transition in the first input signal and a second transition in the second input signal, the second transition having a polarity opposite that of the first transition.

33. The apparatus of claim 20 further comprising a DC blocking capacitance connected between the first node and the reference signal and wherein the variation further comprises a signal at the first node.

34. The apparatus of claim 20 further comprising:
a DC blocking capacitance connected between the first node and the reference signal; and
a bias source connected to the first node; and
wherein the variation comprises a voltage or current at the first node.

35. The apparatus of claim 20 wherein the decision further comprises providing a predetermined delay before turning the switch ON.

36. The apparatus of claim 35 further comprising a mechanism for selectively adjusting the predetermined delay.

37. The apparatus of claim 35 further comprising a mechanism for selectively disabling the predetermined delay.

38. The apparatus of claim 29 further comprising:
a control circuit having an output referenced to the ground reference for providing a first control signal to turn the switch ON and a second control signal to turn the switch OFF;
a transformer connected between the output of the control circuit and the input connection; and
a DC blocking capacitor connected in series between the transformer and the input connection.

* * * * *

UNITED STATES PATENT AND TRADEMARK OFFICE
CERTIFICATE OF CORRECTION

PATENT NO. : 7,368,957 B2  Page 1 of 1
APPLICATION NO. : 11/490573
DATED : May 6, 2008
INVENTOR(S) : John P. Clarkin et al.

It is certified that error appears in the above-identified patent and that said Letters Patent is hereby corrected as shown below:

Column 5, line 66, please delete "1001" and insert --101-- therefor.

Column 6, line 43, please delete "9I" and insert --9I-- therefor.

Column 8, line 5, please delete "10A" and insert --101A-- therefor.

Column 10, line 24, please delete "Vcc" and insert --$V_{cc}$-- therefor.

Column 10, line 26, please delete "Vcc" and insert --$V_{cc}$-- therefor.

Column 14, line 15, in Claim 35, after "wherein" please insert --executing--.

Signed and Sealed this

Thirtieth Day of December, 2008

JON W. DUDAS
*Director of the United States Patent and Trademark Office*